June 3, 1969 M. S. R. HEYNES ET AL 3,447,238

METHOD OF MAKING A FIELD EFFECT TRANSISTOR BY DIFFUSION, COATING WITH AN OXIDE AND PLACING A METAL LAYER ON THE OXIDE

Filed Aug. 9, 1965

INVENTORS
MICHAEL S. R. HEYNES
PETER J. COPPEN
BY [signature]
AGENT

United States Patent Office 3,447,238

Patented June 3, 1969

3,447,238
METHOD OF MAKING A FIELD EFFECT TRANSISTOR BY DIFFUSION, COATING WITH AN OXIDE AND PLACING A METAL LAYER ON THE OXIDE

Michael S. R. Heynes and Peter J. Coppen, Sunnyvale, Calif., assignors to Raytheon Company, Lexington, Mass., a corporation of Delaware Filed Aug. 9, 1965, Ser. No. 478,054
Int. Cl. B01j *17/00;* H01l *7/24*
U.S. Cl. 29—590 8 Claims

ABSTRACT OF THE DISCLOSURE

A method of forming a field effect transistor, having extremely low turn-on or pinch-off voltage, includes the step of diffusion to form spaced source and drain regions. Subsequently an oxide is formed by a thermal vapor action. Following this a metal layer is formed over the surface of the oxide which lies between the source and drain regions. After this contacts are applied to the respective regions.

This invention relates to field effect transistors and has particular reference to the method of making metal-oxide-semiconductor (MOS) field effect transistors having low turn-on or pinch-off voltages.

A typical MOS field effect transistor of the so-called p-channel type is a semiconductor device embodying a silicon semiconductor body of n-type conductivity having diffused into one surface thereof a pair of spaced p-type conductivity source and drain regions, and further having mounted on said surface a metal field plate overlying the n-type surface between the p-type regions and which is physically separated from the surface by a dielectric silicon dioxide layer. The device, also referred to as an "enhancement mode" device, is operated by applying a negative potential to the metal plate, with respect to the body, which creates an inversion layer in the surface of the n-type body between the p-type regions. This inversion layer provides a conducting channel between the p-type regions and the conductivity of the channel increases as the voltage applied to the metal plate is made more negative.

Prior art devices of this type have been provided with dielectric layers which generally comprised a layer of oxide, such as silicon oxide, which oxide layer was applied by thermal growing techniques, as described in U.S. Patent No. 2,930,722. However, the main problem with the thermally grown oxide devices was that high negative turn-on voltages of −8 volts to −15 volts were required to induce the conducting channel, and no way has been known to reduce his voltage in such devices. Turn-on voltage is intended to refer to that voltage between the metal plate overlying the dielectric and the semiconductor element which causes a specific current to flow between the p-regions.

Another typical device of this type is referred to as a "depletion" mode device wherein a conducting region is present between the source and drain for zero bias applied between the field plate and the semiconductor element. In a depletion mode device, a voltage applied to the gate region of a positive polarity (or of opposite polarity to conventional turn-on voltage) will cause the conducting channel to disappear. This voltage is the "pinch-off" voltage and may be defined as that voltage between the metal plate overlying the dielectric and the semiconductor element which causes cessation of current flow between the p-regions.

Silicon is usually thermally oxidized, according to the prior art, by heating it in oxygen or wet oxygen and the $Si$-$SiO_2$ interface formed in this manner has n-type properties. Thus, an n-type silicon body acquires a strongly n-type skin when thermally oridized. In a p-channel field effect transistor this skin region has to be inverted by means of applying a negative potential to the field plate relative to the body. The strongly n-type character of the skin conferred by the oxidation requires that a higher negative potential be used to invert the surface (−8 to −15 volts) than would be expected from the n-type doping of the bulk of the body alone (about −1 volt for 3 ohm-cm. silicon). These recited voltages assume oxide thickness of about 1500 A.

In the case of p-type silicon, thermal oxidation forms an n-type inversion layer at the surface unless the silicon is much more strongly p-type than is desirable in a field effect transistor.

Thus, by utilizing usual thermal oxidation techniques, it is possible to produce only p-channel enchancement mode devices with high turn-on voltage and n-channel depletion mode devices with high pinch-off voltage. It is believed impossible by using usual thermal oxidation techniques to make efficient, reproducible and otherwise satisfactory p-channel depletion or n-channel enhancement mode devices. Also in the prior art, devices made with p-type silicon and n-type diffused regions and thermally grown silicon dioxide have all been depletion mode devices, and it is believed that no way has been found to make them enhancement mode.

In accordance with this invention, it has been found that in devices of the above character an oxide layer which is applied by deposition in a vapor plating process possesses characteristics which permit turn-on voltages as low as −1 volt to be successfully utilized in p-channel enhancement mode devices, and pinch-off voltages as low as +2 volts to be successfully employed in p-channel depletion mode devices. It has been found that the turn-on or pinch-off values can be controlled by providing such an oxide deposition together with a pretreatment which is given the semiconductor slice immediately before the oxide deposition. According to this invention, enhancement mode devices embodying n-type substrates with p-type diffused drain and source regions and depletion mode devices embodying p-type substrates with n-type diffused drain and source regions may be produced by the pretreatment which comprises immersing the devices for about five seconds in a solution of about one part 49% hydrogen fluoride (HF) and about ten parts of deionized water, followed by washing and drying. Enhancement mode devices embodying p-type substrates with n-type diffused drain and source regions and depletion mode devices embodying n-type substrates with p-type source and drain regions may be produced by following the pretreatment with immersion for about ten minutes in concentrated nitric acid ($HNO_3$) at about 100° C., followed by water washing and drying.

Details of this invention and its objects and features will become apparent from the following description taken in connection with the accompanying drawings, in which.

Figure 8:
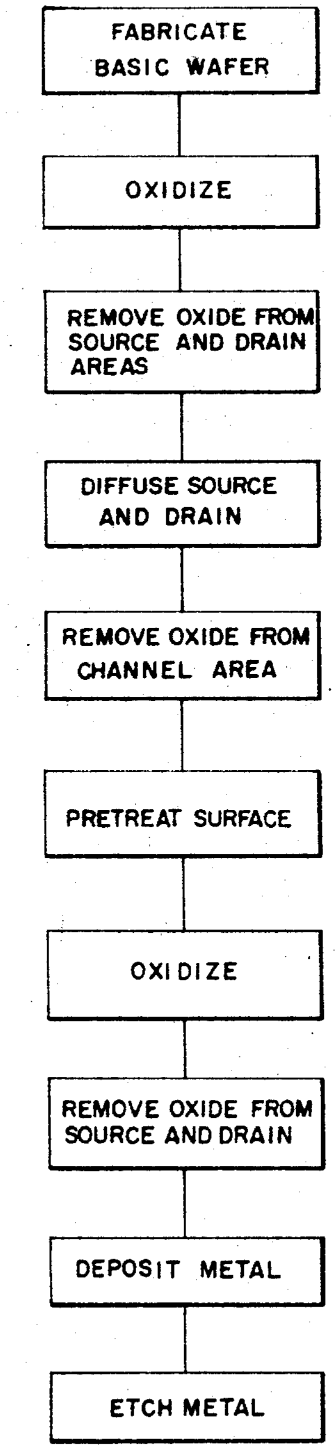
FIG. 8 is a flow diagram illustrating the steps in the process of forming a field effect transistor embodying the invention.

Referring more particularly to the drawings, device 10 comprises a semiconductive wafer 12, typically monocrystalline silicon, having dimensions of approximately .020 inch square by .004 inch thick. The bulk portion of wafer 12 is of n-type conductivity with spaced p-type surface portions 14 and 16 adjacent a major surface 18 of the wafer. P-type portions 14 and 16 are about 0.0001 inch deep and are formed by well-known vapor-solid diffusion and photoresist techniques using a thermally grown oxide layer 26 as a diffusion mask. The portion 20 between the two p-type regions 14 and 16 is approximately 0.0003 inch wide and bounded by p-n junctions 22 and 24 respectively.

A second silicon oxide coating 30 is in intimate contact with surface 18 in the region 20 between the p-regions 14 and 16. Coating 30 may be, for example, about 1000 angstrom units thick and is applied in accordance with this invention by a deposition process to be described in detail in later paragraphs, as opposed to usual thermally grown processes of the prior art.

A metal plate electrode 28 is deposited over the surface of oxide 30 to extend over the region of intersection of the adjacent ends of both p-n junctions 22 and 24 with surface 18. Ohmic contacts 32 and 34 are affixed to p-regions 14 and 16 respectively by well-known techniques such as by deposition through windows formed in the oxide layers 26 and 30 over each p-region whereby the contacts are affixed directly to the p-regions.

A load L and a battery 36 of voltage V are connected serially between contacts 32 and 34, the battery being poled to reverse bias p-n junction 24, junction 22 being connected to the element 12. A voltage source 38 providing a voltage $V_f$ is connected between electrode 28 and contact 32. In response to an accumulation of charge of one polarity on the electrode 28, a charge of opposite polarity is induced in the portion 20 of the wafer adjacent surface 18.

The device of the present invention may serve many purposes and is particularly useful as a power amplifier when a signal source (not shown) is inserted serially with the source of DC voltage $V_f$, and changes in the voltage of the signal source will cause corresponding changes, although with a phase reversal, in the voltage across the load L.

Figure 2:
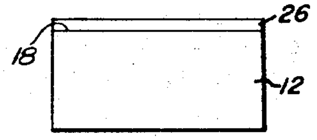
FIGS. 2–7 are diagrammatic views illustrating the product of the invention at various stages during its production.

An enhancement mode p-channel device embodying the present invention may be fabricated starting with an n-type silicon wafer 12 including a uniform concentration of phosphorus and having a resistivity of about three ohm centimeters. After the crystal is sliced, lapped, polished, and cleaned by well-known processes, a silicon dioxide coating 26 is thereafter provided over the surface 18 as indicated in FIG. 2.

Figure 3:
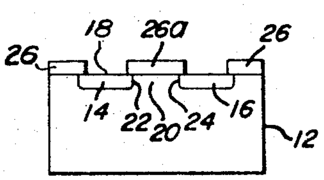
Figure 4:
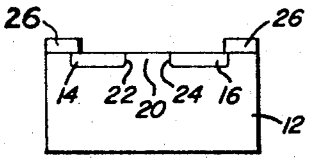

The silicon dioxide coating 26 is applied to the surface 18 of the wafer 12 by heating the wafer for 60 minutes at a temperature of about 1000° C. in a stream of oxygen (about one liter per minute) which was bubbled through water maintained at about 95° C. temperature. Photoresist techniques are used to remove two separate areas of the coating 26 and thus expose two suitably shaped portions of the underlying semiconductor surface 18 through the oxide where the p-type drain and source regions are desired, as seen in FIG. 3. The wafer is then exposed to a boron trioxide vapor. By techniques well known in the art, such as that known as the closed box diffusion process, a surface concentration of about $10^{20}$ atoms/cc. of boron is obtained at the exposed portions. This diffusion provides two surface portions 14 and 16 of p-type conductivity separated by an n-type region 20. The actual diffusion process, briefly, comprises diffusing the boron through the holes etched in the oxide layer 26 in a furnace at about 1050° C. for about 60 minutes in an atmosphere comprising about 1000 p.p.m. diborane in argon at 125 cc./m., oxygen at 45 cc./m., and nitrogen at 1700 cc./m., followed by suitable cleaning. Thereafter, the central portion **26*a* (FIG. 3) of the silicon dioxide layer 26 is removed from the area over the desired channel area 20 between the source area 14 and drain area 16. That is, the silicon dioxide which overlies portion 20 of the wafer is removed as well as over the adjacent edges of the p-n junctions 22 and 24** to produce a structure as shown in FIG. 4.

At this point in the process, in accordance with the present invention, the wafer is pretreated by immersion for about five seconds in a solution of about one part 49% hydrofluoric acid and ten parts of deionized water, and then washed in ionized water and dried.

If the wafer stubstrate 12 is p-type and the source and drain regions 14 and 16 are n-type (by virtue of doping with n-type material such as phosphorus instead of boron), the foregoing pretreatment is followed by immersing the wafer in concentrated nitric acid ($HNO_3$) at about 100° C. for about ten minutes, followed again by ionized water washing and drying.

Such pretreatment before the oxide deposition has been found to provide efficient control of the resultant turn-on voltage whereby the device being made may be turned on with a voltage as low as −1 volt, compared with prior art devices employing thermally grown oxide layers which require turn-on voltages of −8 to −15 volts for p-channel devices; and a turn-on voltage of about +2 volts instead of the prior art pinch-off voltages of from −3 to −6 volts for n-channel devices.

After the pretreatment, a second layer 30 of silicon dioxide is deposited by the following reaction:

$$2H_2+2CO_2+SiCl_4=SiO_2+4HCl+2CO$$

The chemistry of this method of depositing $SiO_2$ has been described by Steinmaier and Bloem in Journal of the Electrochemical Society, vol. III, February 1964, p. 206. The reaction may be carried out conveniently in a reactor used for epitaxial deposition of silicon which normally uses the reaction:

$$SiCl_4+2H_2=Si+4HCl$$

As described by Steinmaier and Bloem, $SiO_2$ is deposited immediately following a silicon deposition merely by adding $CO_2$ to the $SiCl_4+H_2$ reaction mixture already flowing into the reactor for the silicon deposition. The reaction changes smoothly from silicon deposition to oxide deposition, and good quality oxides for planar device processing are easily produced in this way. However, for most conceivable device applications, the immediate deposition of $SiO_2$ on the substrate placed in the reactor is required, and initiation of the oxide deposition by starting up silicon deposition is unacceptable.

In attempts to deposit a good quality oxide film on silicon wafers without a predeposit of silicon, the polished silicon wafers were heated at various temperatures from 900° to 1200° C. in hydrogen and then the $SiCl_4$ and $CO_2$ were added to the gas stream in just the same manner as $SiCl_4$ alone is added for epitaxial silicon deposition. In spite of varying the substrate temperature, the order in which the reactants were added, the concentration of reactants, and the surface preparation of the silicon substrates, good quality $SiO_2$ deposits could not be produced. The deposits always had a cloudy appearance, usually with "chalky" spots. Such deposits are unacceptable, particularly for planar device processing which requires clear, transparent oxides with a smooth, bright finish.

According to this invention, it has been discovered that if the $H_2+CO_2+SiCl_4$ reaction mixture is passed into the reactor as the substrates are heated up from room temperature, instead of waiting for the intended deposition temperature to be reached before adding the $CO_2$ and $SiCl_4$ to the $H_2$ stream, good quality oxide films with the desired electrical properties can be consistently produced.

Depositions, therefore, are carried out according to this invention by the following steps:

(1) Place substrate wafers in reactor.

(2) Flush reactor for about five minutes with mixture of $H_2+CO_2+SiCl_4$.

(3) Using R.F. generator, bring temperature rapidly (one to five minutes) to intended deposition temperature.

(4) Maintain intended level of deposition temperature for sufficient time required to deposit oxide to the required thickness.

(5) Remove heat and flow of $SiCl_4$ and $CO_2$, and allow substrates to cool in $H_2$ flow.

Oxides of good quality can be produced with $SiCl_4$ molecular percentages in the reaction mixture of 0.1% to 3%, and $CO_2$ molecular percentages of 0.5% to 12%, for example. Temperatures of, for example, from 850° C. to 1250° C. are also satisfactory.

In applying the oxide to the gate areas of field effect transistors, the following conditions are favored in one example of the process:

Total gas flow rate=approximately 1400 cc. per minute in 2" diameter reactor.
$SiCl_4$ content=0.6 molecular percent.
$CO_2$ content=2 molecular percent.
Deposition temperature=950° as indicated by disappearing-filament optical pyrometer.

Under these conditions, the oxide deposition rate is about 200 A. per minute and may be continued for as long as necessary to build up the oxide layer to the desired depth, for example 1500 Angstrom units.

With such a deposited oxide there is created a silicon-silicon dioxide interface which is slightly n-type when utilizing the hydrofluoric acid or slightly p-type when the hot nitric acid is utilized. This results in devices which can be operated with the desired conveniently low and easily reproduced inversion voltages.

Figure 1:
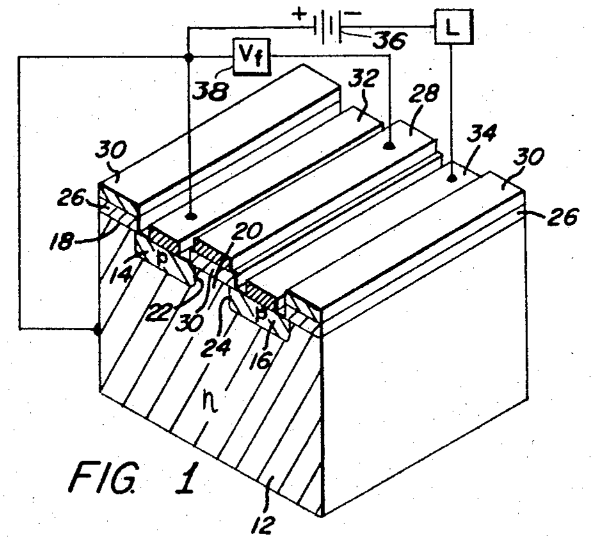
FIG. 1 is a vertical sectional view of one embodiment of this invention.
Figure 5:
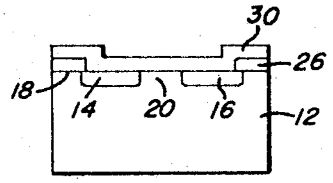
Figure 6:
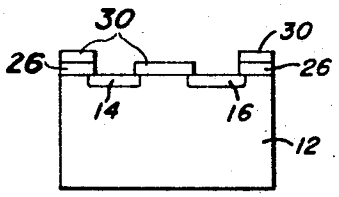
Figure 7:
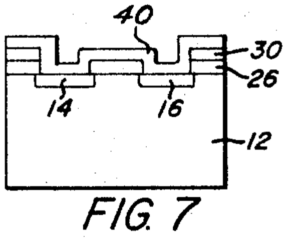

After the silicon dioxide layer 30 is deposited as described above over the entire exposed surface 18 of wafer 12 (and consequently over the remaining portions of oxide layer 26) and the p-type source and drain regions 14 and 16, as shown in FIG. 5, by photoengraving processes this oxide is removed from those areas overlying the source and drain 14 and 16 where metal contacts 32 and 34 are to be applied, thus producing the structure illustrated in FIG. 6. At this point, the wafers are cleaned by immersion in 5% HF for five seconds, water washed and dried, and then are placed in an evaporator where a layer 40 of about 500 Angstrom units of chromium and about 7000 Angstrom units of gold is deposited over the oxide layer 30 and the exposed surfaces of source and drain regions 14 and 16. The structure then appears substantially as shown in FIG. 7 wherein the metal layer 40 can be seen. Other suitable contacting metals may also be used. Then by photoengraving, the deposited metal layer 40 is etched so as to leave the metal field plate 28 (FIG. 1) over the channel area 20 and also to leave the metal contacts 32 and 34 in direct contact with source and drain regions 14 and 16. To complete the device, the wafer may be lapped on the back side to the desired thickness.

The foregoing detailed description refers specifically to the production of enhancement mode devices, utilizing either p-type or n-type wafers having opposite conductivity type diffused source and drain regions. However, it is to be understood that depletion mode devices may be made by similar processes. That is, depletion mode devices embodying p-type substrates may be made by employing only the first portion of the pretreatment process described herein, while depletion mode devices embodying n-type substrates will require both portions of the pretreatment processes which include the immersion in nitric acid.

Enhancement mode devices produced in accordance with the foregoing description will operate with turn-on voltages as low as −1 volt in the case of p-channel devices, and as low as +1 volt in the case of n-channel devices. Likewise, depletion mode devices produced as described will operate with pinch-off voltages as low as +3 volts in the case of p-channel devices, and as low as −3 volts in the case of n-channel devices.

It will be apparent from the foregoing that all of the objects and advantages of this invention have been achieved in the production of an improved field effect transistor having controlled low voltage turn-on or pinch-off characteristics.

We claim:

1. A method of making a field effect transistor comprising
- diffusing into a surface of a semiconductor element of one conductivity type a pair of spaced source and drain regions of opposite conductivity type,
- depositing a layer of oxide over said surface by the reaction $2H_2+2CO_2+SiCl_4=SiO_2+4HCl+2CO$,
- removing said oxide layer from areas overlying said source and drain regions,
- applying a metal contact over the oxide layer in the area thereof which overlies the surface between the source and drain regions,
- and applying metal contacts directly to said respective source and drain regions in the areas where said oxide layer was removed.

2. A method of making a field effect transistor substantially as set forth in claim 1, wherein said oxide deposition step is carried out in a reactor used for epitaxial deposition which uses the reaction $SiCl_4+2H_2=Si+4HCl$ and wherein $SiO_2$ is deposited by adding $CO_2$ to the $SiCl_4+H_2$ reaction mixture.

3. A method of making a field effect transistor substantially as set forth in claim 1, wherein said oxide deposition step comprises
- placing the element in a reactor of a type suitable for epitaxial deposition,
- heating the element to a temperature within the range of 850° C. to 1250° C. in a flowing hydrogen atmosphere,
- adding $SiCl_4$ and $CO_2$ to the flowing hydrogen while the temperature of the element is being raised to the selected level,
- and thereafter allowing the element in the reactor to cool in flowing hydrogen.

4. A method of making a field effect transistor substantially as set forth in claim 3, wherein the molecular percentage of $SiCl_4$ in the reaction mixture is about from 0.1% to 3%.
- and the molecular percentage of $CO_2$ in the reaction mixture is about from 0.5% to 12%.

5. A method of making a field effect transistor comprising
- diffusing into a surface of a semiconductor element of one conductivity type a pair of spaced source and drain regions of opposite conductivity type,
- treating said surface by immersing the element in a solution of hydrofluoric acid in water,
- depositing a layer of oxide over said surface by the reaction $2H_2+2CO_2+SiCl_4=SiO_2+4HCl+2CO$,
- removing said oxide layer from areas overlying said source and drain regions,
- applying a metal contact over the oxide layer in the area thereof which overlies the surface between the source and drain regions,
- and applying metal contacts directly to said respective source and drain regions in the areas where said oxide layer was removed.

6. A method of making a field effect transistor substantially as set forth in claim 5, wherein said treatment step is directly followed by immersing the element in concentrated hot nitric acid.

7. A method of making a field effect transistor substantially as set forth in claim 5, wherein said treatment step comprises immersing the element for about five seconds in a solution of about one part 49% hydrofluoric acid and about ten parts deionized water, washing and drying,
- and wherein said oxide deposition step comprises placing the element in a reactor of a type suitable for epitaxial deposition,
- heating the element to a temperature within the range of 850° C. to 1250° C. in a flowing hydrogen atmosphere, adding $SiCl_4$ and $CO_2$ to the flowing hydrogen while the temperature of the element is being raised to the selected level, and thereafter allowing the element in the reactor to cool in flowing hydrogen.

8. A method of making a field effect semiconductor device substantially as set forth in claim 7, wherein said treatment step is directly followed by immersing the element for about ten minutes in concentrated nitric acid at about 100° C., and washing and drying the surface.

References Cited

UNITED STATES PATENTS

| | | | |
|---|---|---|---|
| 3,114,663 | 12/1963 | Klerer. | |
| 3,144,366 | 8/1964 | Rideout. | |
| 3,184,823 | 5/1965 | Little | 148—187 XR |
| 3,313,661 | 4/1967 | Blake | 148—187 |

HYLAND BIZOT, *Primary Examiner.*

U.S. Cl. X.R.

148—1.5, 186, 187